(12) United States Patent
Resch et al.

(10) Patent No.: US 12,174,853 B2
(45) Date of Patent: Dec. 24, 2024

(54) ASYNCHRONOUS DATA REPLICATION IN A STORAGE NETWORK

(71) Applicant: Pure Storage, Inc., Mountain View, CA (US)

(72) Inventors: Jason K. Resch, Warwick, RI (US); Scott M. Horan, Clarendon Hills, IL (US); Ravi V. Khadiwala, Bartlett, IL (US); Greg R. Dhuse, Chicago, IL (US)

(73) Assignee: Pure Storage, Inc., Santa Clara, CA (US)

( * ) Notice: Subject to any disclaimer, the term of this patent is extended or adjusted under 35 U.S.C. 154(b) by 0 days.

(21) Appl. No.: 18/323,729

(22) Filed: May 25, 2023

(65) Prior Publication Data

US 2023/0306041 A1 Sep. 28, 2023

Related U.S. Application Data

(60) Continuation of application No. 17/660,907, filed on Apr. 27, 2022, now Pat. No. 11,669,546, which is a
(Continued)

(51) Int. Cl.
*G06F 16/27* (2019.01)
*H04L 67/1095* (2022.01)
(Continued)

(52) U.S. Cl.
CPC .......... *G06F 16/27* (2019.01); *H04L 67/1095* (2013.01); *G06F 3/0619* (2013.01);
(Continued)

(58) Field of Classification Search
CPC .............................. G06F 16/27; H04L 67/1095
See application file for complete search history.

(56) References Cited

U.S. PATENT DOCUMENTS

| 4,092,732 A | 5/1978 | Ouchi |
| 5,454,101 A | 9/1995 | Mackay |

(Continued)

OTHER PUBLICATIONS

Chung; An Automatic Data Segmentation Method for 3D Measured Data Points; National Taiwan University; pp. 1-8; 1998.
(Continued)

*Primary Examiner* — Joseph D Torres
(74) *Attorney, Agent, or Firm* — GARLICK & MARKISON; Harry S. Tyson, Jr.

(57) ABSTRACT

Methods and apparatus for asynchronous replication of data in a storage network. In an embodiment, a processing module(s) of a computing device identifies at least a first storage set and a second storage set for replicated storage of data. The processing module maintains a synchronization schedule for the first storage set and the second storage set. After initiating storage of a data object in the first storage set (e.g., using first error encoding parameters), the processing module determines, based at least in part on the synchronization schedule, to synchronize the first storage set and the second storage set. In response to determining to synchronize the first and second storage sets, the processing module determines that the second storage set requires the data object to maintain synchronization with the first storage set and facilitates storage of the data object in the second storage set (e.g., using second error encoding parameters).

19 Claims, 12 Drawing Sheets

Related U.S. Application Data continuation-in-part of application No. 17/248,424, filed on Jan. 25, 2021, now Pat. No. 11,327,840, which is a division of application No. 16/399,215, filed on Apr. 30, 2019, now Pat. No. 10,936,417, which is a division of application No. 16/031,488, filed on Jul. 10, 2018, now Pat. No. 10,318,380, which is a division of application No. 15/184,614, filed on Jun. 16, 2016, now Pat. No. 10,025,665.

(60) Provisional application No. 62/186,590, filed on Jun. 30, 2015.

(51) Int. Cl.

| | |
|---|---|
| G06F 3/06 | (2006.01) |
| G06F 11/10 | (2006.01) |
| G06F 11/16 | (2006.01) |
| G06F 16/22 | (2019.01) |
| G06F 16/2457 | (2019.01) |
| G06F 16/2458 | (2019.01) |
| H03M 13/15 | (2006.01) |
| H03M 13/33 | (2006.01) |
| H03M 13/37 | (2006.01) |
| H04L 67/06 | (2022.01) |
| H04L 67/1097 | (2022.01) |

(52) U.S. Cl.
CPC ............. *G06F 3/064* (2013.01); *G06F 3/065* (2013.01); *G06F 3/067* (2013.01); *G06F 11/1076* (2013.01); *G06F 11/1662* (2013.01); *G06F 16/22* (2019.01); *G06F 16/24578* (2019.01); *G06F 16/2471* (2019.01); *G06F 16/273* (2019.01); *G06F 2201/805* (2013.01); *H03M 13/1515* (2013.01); *H03M 13/33* (2013.01); *H03M 13/3761* (2013.01); *H04L 67/06* (2013.01); *H04L 67/1097* (2013.01)

(56) References Cited

U.S. PATENT DOCUMENTS

| | | |
|---|---|---|
| 5,485,474 A | 1/1996 | Rabin |
| 5,774,643 A | 6/1998 | Lubbers |
| 5,802,364 A | 9/1998 | Senator |
| 5,809,285 A | 9/1998 | Hilland |
| 5,890,156 A | 3/1999 | Rekieta |
| 5,987,622 A | 11/1999 | Lo Verso |
| 5,991,414 A | 11/1999 | Garay |
| 6,012,159 A | 1/2000 | Fischer |
| 6,058,454 A | 5/2000 | Gerlach |
| 6,128,277 A | 10/2000 | Bruck |
| 6,175,571 B1 | 1/2001 | Haddock |
| 6,192,472 B1 | 2/2001 | Garay |
| 6,256,688 B1 | 7/2001 | Suetaka |
| 6,272,658 B1 | 8/2001 | Steele |
| 6,301,604 B1 | 10/2001 | Nojima |
| 6,356,949 B1 | 3/2002 | Katsandres |
| 6,366,995 B1 | 4/2002 | Vilkov |
| 6,374,336 B1 | 4/2002 | Peters |
| 6,415,373 B1 | 7/2002 | Peters |
| 6,418,539 B1 | 7/2002 | Walker |
| 6,449,688 B1 | 9/2002 | Peters |
| 6,567,948 B2 | 5/2003 | Steele |
| 6,571,282 B1 | 5/2003 | Bowman-Amuah |
| 6,609,223 B1 | 8/2003 | Wolfgang |
| 6,718,361 B1 | 4/2004 | Basani |
| 6,760,808 B2 | 7/2004 | Peters |
| 6,785,768 B2 | 8/2004 | Peters |
| 6,785,783 B2 | 8/2004 | Buckland |
| 6,826,711 B2 | 11/2004 | Moulton |
| 6,879,596 B1 | 4/2005 | Dooply |
| 7,003,688 B1 | 2/2006 | Pittelkow |
| 7,024,451 B2 | 4/2006 | Jorgenson |
| 7,024,609 B2 | 4/2006 | Wolfgang |
| 7,080,101 B1 | 7/2006 | Watson |
| 7,103,824 B2 | 9/2006 | Halford |
| 7,103,915 B2 | 9/2006 | Redlich |
| 7,111,115 B2 | 9/2006 | Peters |
| 7,140,044 B2 | 11/2006 | Redlich |
| 7,146,644 B2 | 12/2006 | Redlich |
| 7,171,493 B2 | 1/2007 | Shu |
| 7,222,133 B1 | 5/2007 | Raipurkar |
| 7,240,236 B2 | 7/2007 | Cutts |
| 7,272,613 B2 | 9/2007 | Sim |
| 7,636,724 B2 | 12/2009 | de la Torre |
| 9,432,298 B1 | 8/2016 | Smith |
| 9,684,558 B2 | 6/2017 | Grube |
| 10,025,665 B2 | 7/2018 | Resch |
| 2002/0062422 A1 | 5/2002 | Butterworth |
| 2002/0166079 A1 | 11/2002 | Ulrich |
| 2003/0018927 A1 | 1/2003 | Gadir |
| 2003/0037261 A1 | 2/2003 | Meffert |
| 2003/0065617 A1 | 4/2003 | Watkins |
| 2003/0084020 A1 | 5/2003 | Shu |
| 2004/0024963 A1 | 2/2004 | Talagala |
| 2004/0122917 A1 | 6/2004 | Menon |
| 2004/0215998 A1 | 10/2004 | Buxton |
| 2004/0228493 A1 | 11/2004 | Ma |
| 2005/0100022 A1 | 5/2005 | Ramprashad |
| 2005/0114594 A1 | 5/2005 | Corbett |
| 2005/0125593 A1 | 6/2005 | Karpoff |
| 2005/0131993 A1 | 6/2005 | Fatula, Jr. |
| 2005/0132070 A1 | 6/2005 | Redlich |
| 2005/0144382 A1 | 6/2005 | Schmisseur |
| 2005/0229069 A1 | 10/2005 | Hassner |
| 2006/0047907 A1 | 3/2006 | Shiga |
| 2006/0136448 A1 | 6/2006 | Cialini |
| 2006/0156059 A1 | 7/2006 | Kitamura |
| 2006/0224603 A1 | 10/2006 | Correll, Jr. |
| 2007/0079081 A1 | 4/2007 | Gladwin |
| 2007/0079082 A1 | 4/2007 | Gladwin |
| 2007/0079083 A1 | 4/2007 | Gladwin |
| 2007/0088970 A1 | 4/2007 | Buxton |
| 2007/0174192 A1 | 7/2007 | Gladwin |
| 2007/0214285 A1 | 9/2007 | Au |
| 2007/0234110 A1 | 10/2007 | Soran |
| 2007/0283167 A1 | 12/2007 | Venters, III |
| 2009/0094251 A1 | 4/2009 | Gladwin |
| 2009/0094318 A1 | 4/2009 | Gladwin |
| 2010/0023524 A1 | 1/2010 | Gladwin |
| 2010/0100939 A1* | 4/2010 | Mahaffey ............ H04L 63/102 726/4 |
| 2010/0268692 A1* | 10/2010 | Resch ................. G06F 16/1748 707/687 |
| 2011/0040942 A1* | 2/2011 | Akirav ................ G06F 11/1456 711/E12.001 |
| 2011/0314355 A1 | 12/2011 | Grube |
| 2014/0040417 A1 | 2/2014 | Gladwin |
| 2015/0309890 A1* | 10/2015 | Pershin ............... H04L 67/1095 714/4.11 |
| 2015/0309901 A1* | 10/2015 | Pershin ..................... G06F 3/06 714/6.3 |

OTHER PUBLICATIONS

Harrison; Lightweight Directory Access Protocol (LDAP): Authentication Methods and Security Mechanisms; IETF Network Working Group; RFC 4513; Jun. 2006; pp. 1-32.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

Legg; Lightweight Directory Access Protocol (LDAP): Syntaxes and Matching Rules; IETF Network Working Group; RFC 4517; Jun. 2006; pp. 1-50.

Plank, T1: Erasure Codes for Storage Applications; FAST2005, 4th Usenix Conference on File Storage Technologies; Dec. 13-16, 2005; pp. 1-74.

(56) References Cited

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Satran, et al.; Internet Small Computer Systems Interface (iSCSI); IETF Network Working Group; RFC 3720; Apr. 2004; pp. 1-257.

Sciberras; Lightweight Directory Access Protocol (LDAP): Schema for User Applications; IETF Network Working Group; RFC 4519; Jun. 2006; pp. 1-33.

Sermersheim; Lightweight Directory Access Protocol (LDAP): The Protocol; IETF Network Working Group; RFC 4511; Jun. 2006; pp. 1-68.

Shamir; How to Share a Secret; Communications of the ACM; vol. 22, No. 11; Nov. 1979; pp. 612-613.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Wildi; Java iSCSi Initiator; Master Thesis; Department of Computer and Information Science, University of Konstanz; Feb. 2007; 60 pgs.

Xin, et al.; Evaluation of Distributed Recovery in Large-Scale Storage Systems; 13th IEEE International Symposium on High Performance Distributed Computing; Jun. 2004; pp. 172-181.

Zeilenga; Lightweight Directory Access Protocol (LDAP): Directory Information Models; IETF Network Working Group; RFC 4512; Jun. 2006; pp. 1-49.

Zeilenga; Lightweight Directory Access Protocol (LDAP): Internationalized String Preparation; IETF Network Working Group; RFC 4518; Jun. 2006; pp. 1-14.

Zeilenga; Lightweight Directory Access Protocol (LDAP): String Representation of Distinguished Names; IETF Network Working Group; RFC 4514; Jun. 2006; pp. 1-15.

Zeilenga; Lightweight Directory Access Protocol (LDAP): Technical Specification Road Map; IETF Network Working Group; RFC 4510; Jun. 2006; pp. 1-8.

* cited by examiner

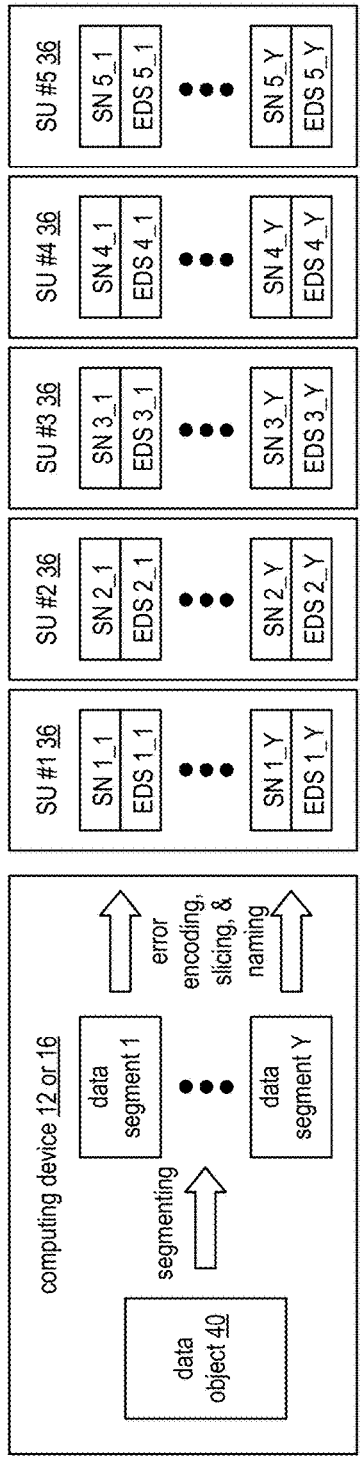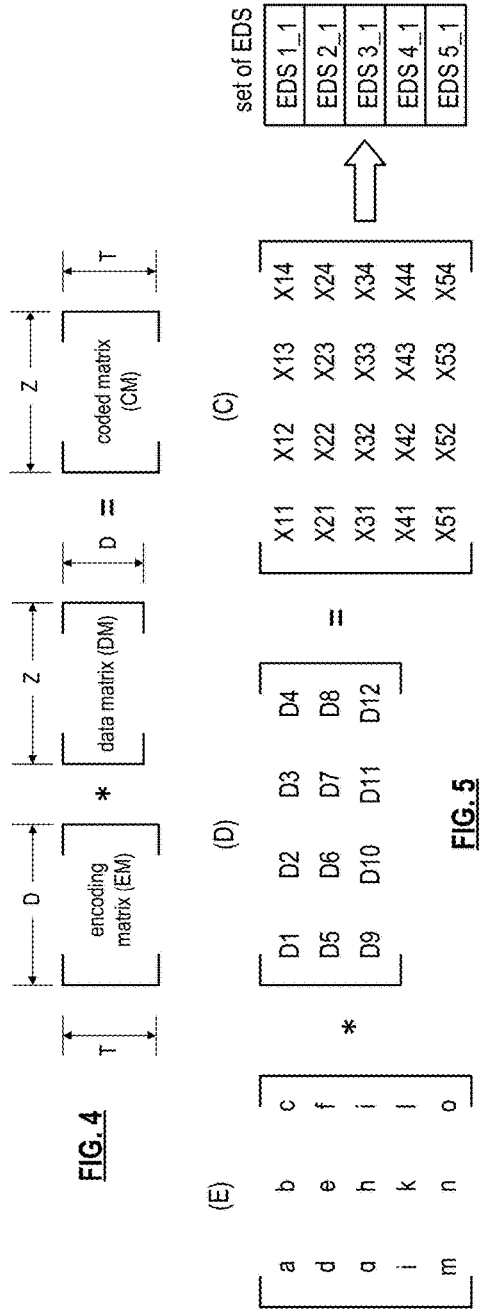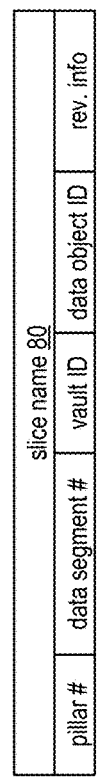

ASYNCHRONOUS DATA REPLICATION IN A STORAGE NETWORK

CROSS-REFERENCE TO RELATED APPLICATIONS

The present U.S. Utility Patent application claims priority pursuant to 35 U. S. C. § 120 as a continuation of U.S. Utility application Ser. No. 17/660,907, filed Apr. 27, 2022, entitled "SYNCHRONIZING REPLICATED DATA IN A STORAGE NETWORK", which claims priority pursuant to 35 U.S.C. § 120 as a continuation-in-part of U.S. Utility application Ser. No. 17/248,424, entitled "MULTI-STAGE DATA RECOVERY IN A DISTRIBUTED STORAGE NETWORK," filed Jan. 25, 2021, issued as U.S. Pat. No. 11,327,840 on May 10, 2022, which claims priority pursuant to 35 U.S.C. § 121 as a divisional of U.S. Utility application Ser. No. 16/399,215, entitled "MULTI-STAGE SLICE RECOVERY IN A DISPERSED STORAGE NETWORK", filed Apr. 30, 2019, issued as U.S. Pat. No. 10,936,417 on Mar. 2, 2021, which is a divisional of U.S. Utility application Ser. No. 16/031,488, entitled "MULTI-STAGE SLICE RECOVERY IN A DISPERSED STORAGE NETWORK", filed Jul. 10, 2018, issued as U.S. Pat. No. 10,318,380 No. on Jun. 11, 2019, which is a divisional of U.S. Utility application Ser. No. 15/184,614, entitled "MULTI-STAGE SLICE RECOVERY IN A DISPERSED STORAGE NETWORK", filed Jun. 16, 2016, issued as U.S. Pat. No. 10,025,665 on Jul. 17, 2018, which claims priority pursuant to 35 U.S.C. § 119(e) to U.S. Provisional Application No. 62/186,590, entitled "ACCESSING DATA WHEN TRANSFERRING THE DATA BETWEEN STORAGE FACILITIES", filed Jun. 30, 2015, all of which are hereby incorporated herein by reference in their entirety and made part of the present U.S. Utility Patent Application for all purposes.

BACKGROUND

Technical Field of the Invention

This invention relates generally to computer networks and more particularly to synchronizing data that is replicated in a storage network.

Description of Related Art

Computing devices are known to communicate data, process data, and/or store data. Such computing devices range from wireless smart phones, laptops, tablets, personal computers (PC), workstations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote storage system. The remote storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency, and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE DRAWINGS

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of a slice name of an encoded data slice (EDS) in accordance with the present disclosure;

DETAILED DESCRIPTION

Figure 1:
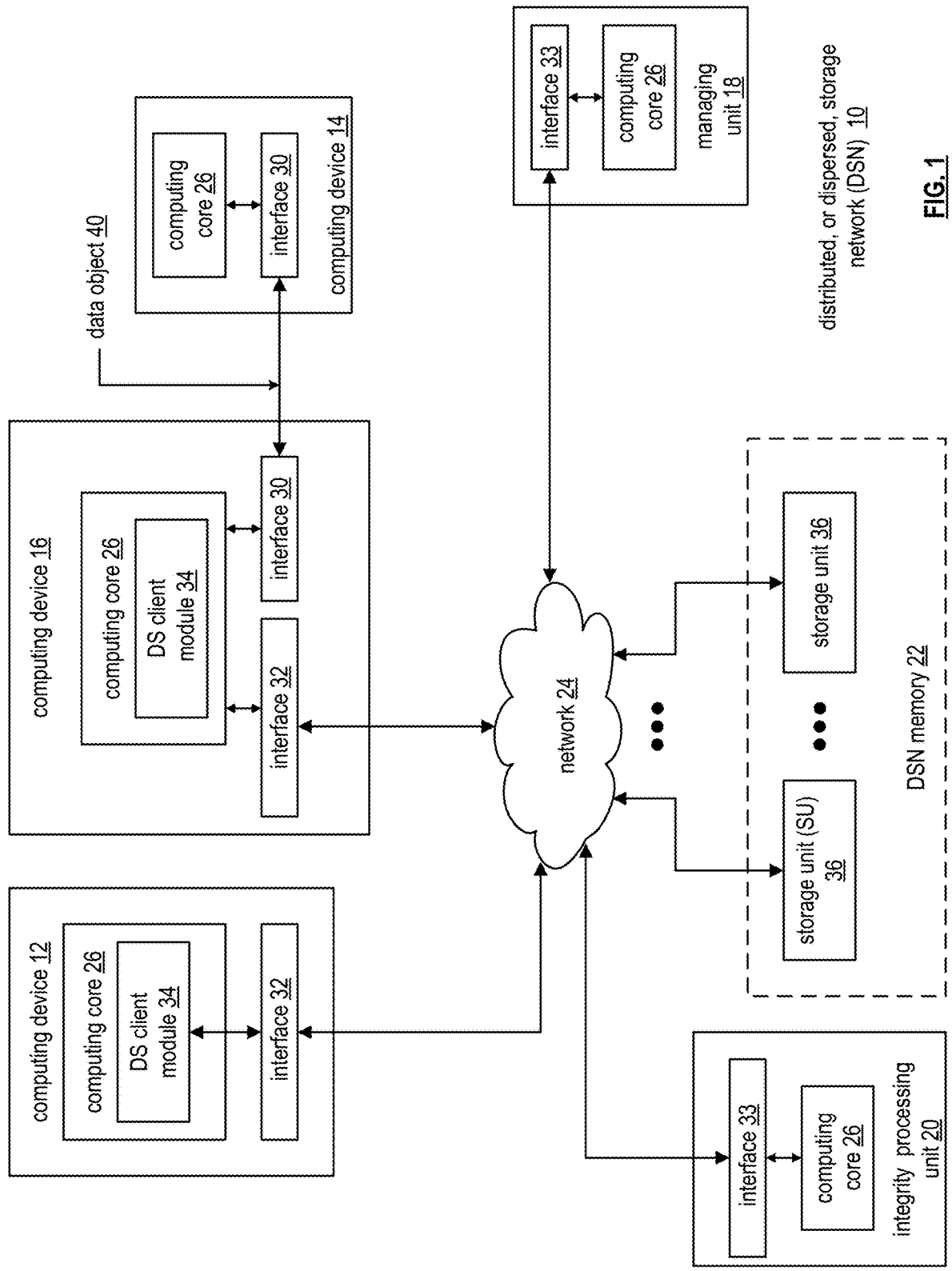
FIG. 1 is a schematic block diagram of an embodiment of a dispersed or distributed storage network (DSN) in accordance with the present disclosure.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
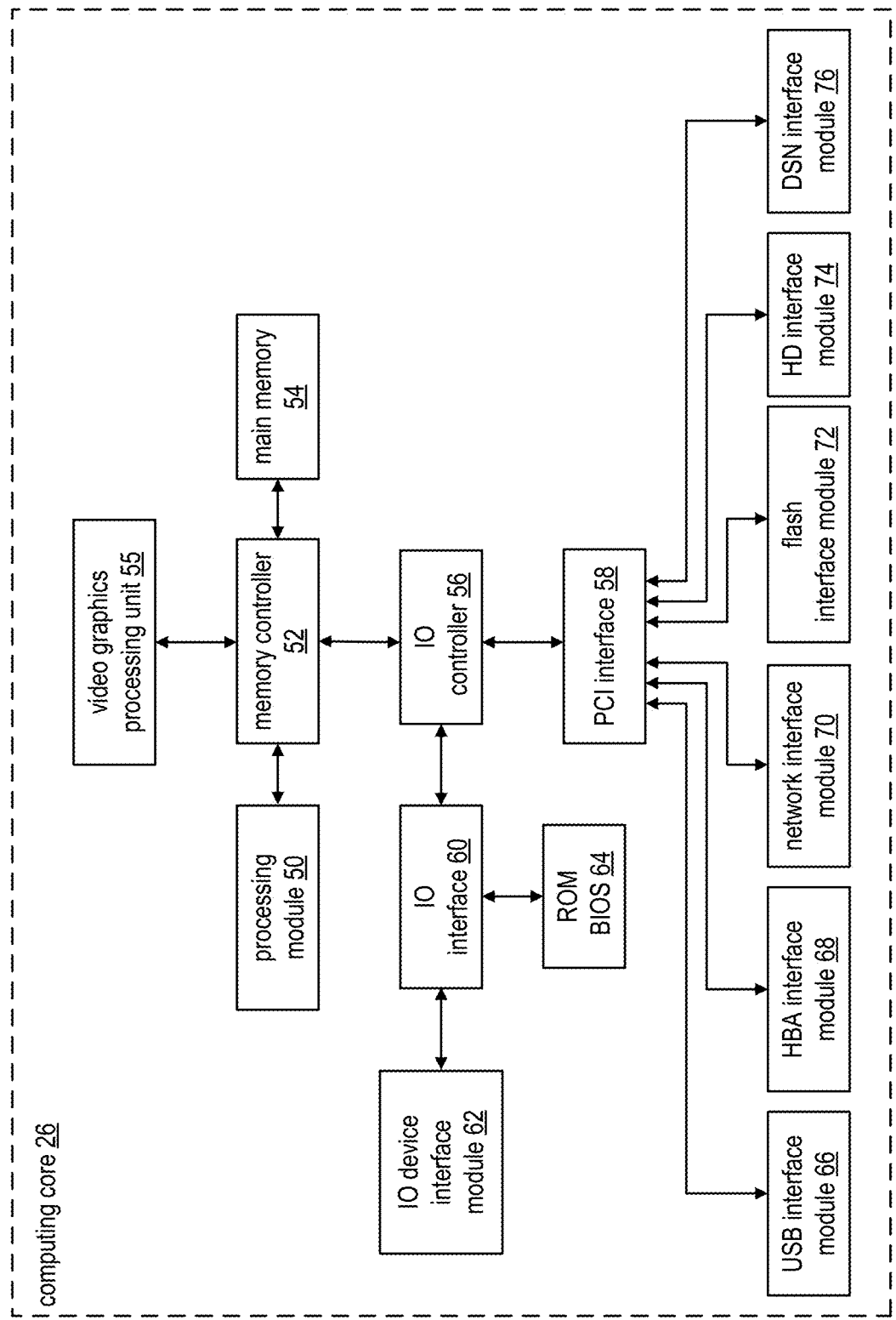
FIG. 2 is a schematic block diagram of an embodiment of a computing core in accordance with the present disclosure.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

To support data storage integrity verification within the distributed computing system 10, the integrity processing unit 20 (and/or other devices in the DSN 10) may perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. The rebuilt slices may then be written to DSN memory 22. Note that the integrity processing unit 20 may be a separate unit as shown, included in DSN memory 22, included in the computing device 16, and/or distributed among the storage units 36. As described more fully below in conjunction with FIGS. 9-12, a multi-stage decoding process may be employed in certain circumstances to recover data even when the number of valid encoded data slices of a set of encoded data slices is less than a relevant decode threshold number.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it dispersed storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent on the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value X11=aD1+bD5+cD9, X12=aD2+bD6+cD10, . . . X53=mD3+nD7+oD11, and X54=mD4+nD8+oD12.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN Y.

Figure 7:
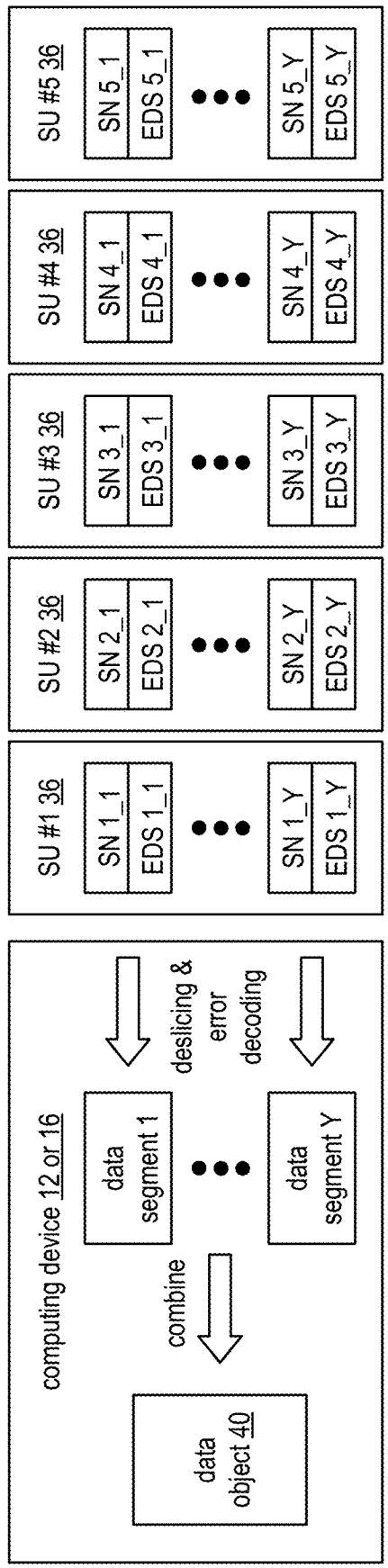
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
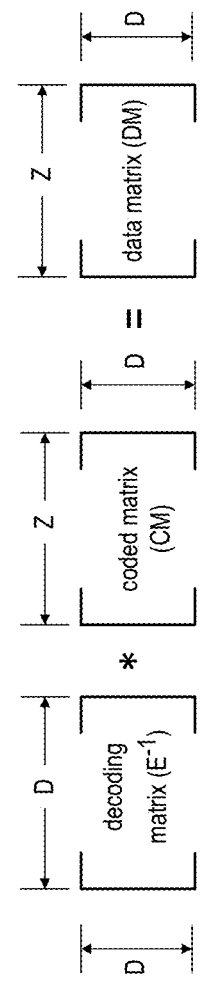
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
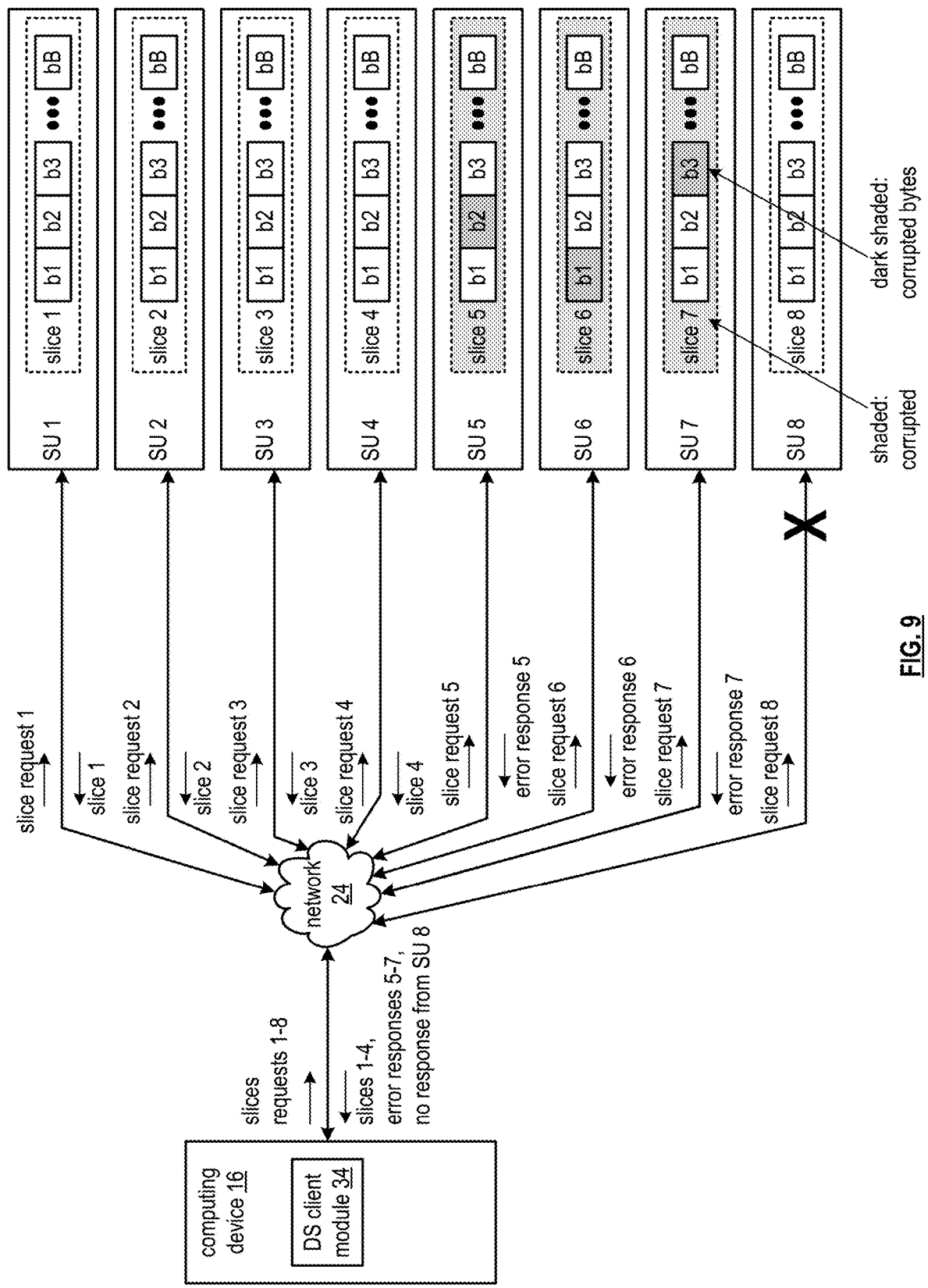
FIGS. 9 and 10 are schematic block diagrams of an embodiment of a storage network in accordance with the present disclosure.
Figure 10:
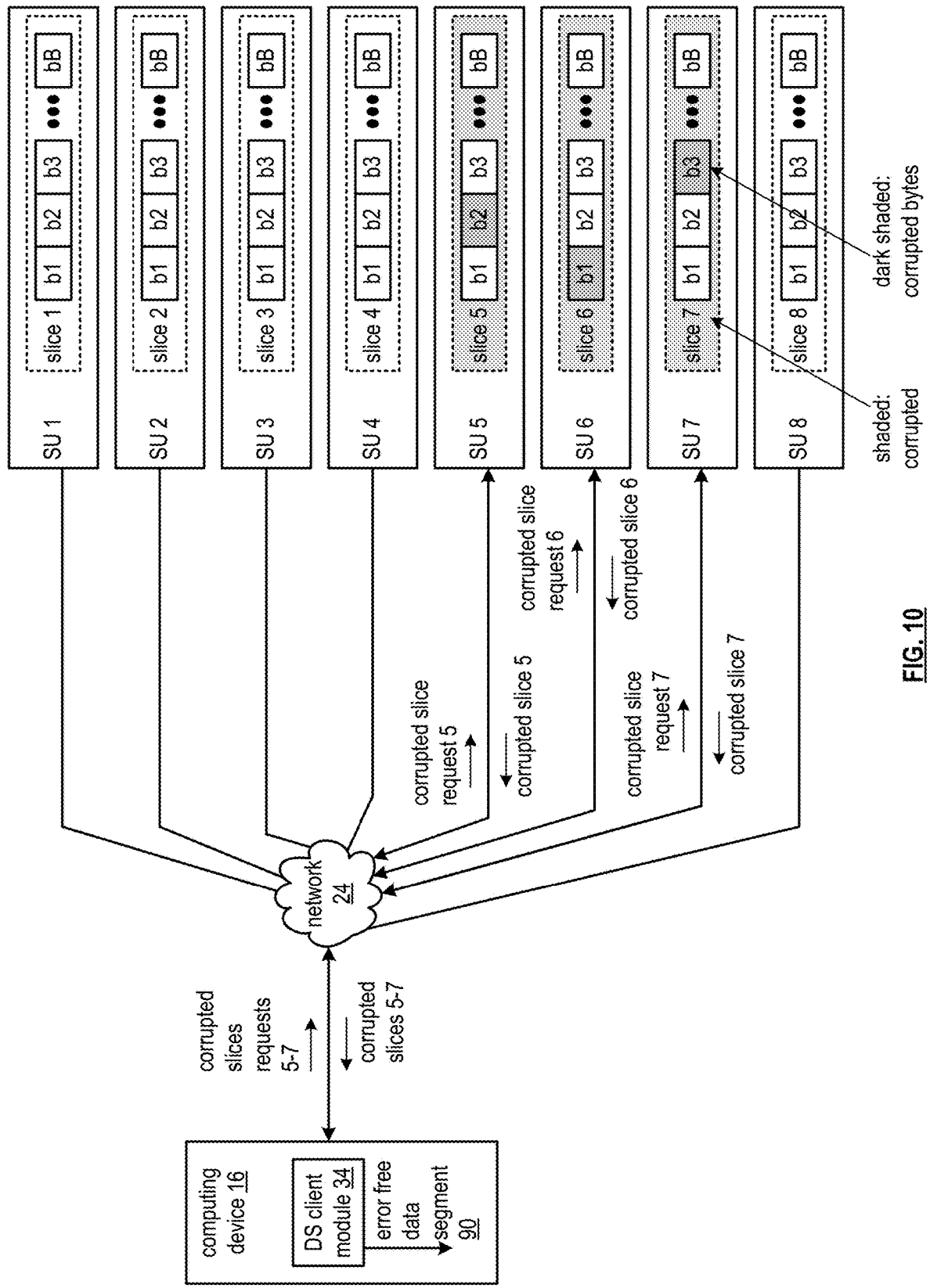

FIGS. 9 and 10 are schematic block diagrams of an embodiment of a distributed storage network (DSN) in accordance with the present disclosure. The illustrated DSN includes the computing device 16 of FIG. 1, the network 24 of FIG. 1, and a set of storage units 1-8. The computing device 16 includes the DS client module 34 of FIG. 1. Each storage unit 1-8 may be implemented utilizing the storage unit 36 of FIG. 1. The DSN functions to recover stored and segmented data, where a data segment is dispersed storage error encoded in accordance with dispersal parameters to produce a set of encoded data slices 1-8 for storage in the set of storage units 1-8, respectively. The dispersal parameters include a width (e.g., n) and a decode threshold number k, where at least a decode threshold number of encoded data slices of the set of n encoded data slices is required to recover the data segment. For example, eight storage units are utilized when the width is eight and five encoded data slices are required to recover the data segment when the decode threshold is five. Each encoded data slice includes a plurality of bytes b1-bB. As discussed more fully below, byte-by-byte recovery/rebuilding of the encoded data segment may be possible utilizing uncorrupted bytes in a common byte position from a decode threshold number of encoded data slices.

Referring more particularly to FIG. 9, in an exemplary operation of the recovery of stored data, the DS client module 34 issues at least a decode threshold number of slice requests to the set of storage units to initiate retrieval of a decode threshold number of slices to enable recovery of the data segment. For example, the DS client module 34 issues, via the network 24, slice requests 1-8 to the memory units 1-8 in an attempt to recover at least the decode threshold number of encoded data slices of the set of encoded data slices 1-8. Each storage unit receiving a corresponding slice request recovers a corresponding requested encoded data slice from a local memory, and may perform an integrity test on the retrieved encoded data slice. In one example, the storage unit may compare a calculated integrity value to a stored integrity value. Potential corruption of the requested encoded data slice is indicated when the calculated integrity value compares unfavorably to the stored integrity value (e.g., not substantially the same).

The storage unit generates a slice response based on the integrity test. For example, storage unit 5 generates a slice response 5 that indicates that the encoded data slice 5 is likely corrupt when the corresponding integrity test indicates the potential corruption. In certain embodiments, the storage unit 5 may include the encoded data slice 5 in the slice response 5 in conjunction with an error indication. As another example, storage unit 4 generates a slice response 4 that includes the encoded data slice 4 when the corresponding integrity test indicates no potential corruption. In the illustrated embodiment, storage unit 8 is unavailable and does not respond to slice request 8 (which request may not be sent if the DS client module 34 has advance knowledge of the unavailability of storage unit 8).

As illustrated in FIG. 10, when receiving less than the decode threshold number of uncorrupted encoded data slices (e.g., the DS client module 34 receives encoded data slices 1-4) and an indication of at least one corrupted encoded data slice (e.g., slice responses 5-7 indicating that the encoded data slices 5-7 are available but are potentially corrupted), the DS client module 34 selects one or more potentially corrupt encoded data slices for retrieval. For example, the DS client module 34 may attempt to retrieve two corrupted slices beyond the relevant decode threshold number of encoded data slices for each corrupted slice of the decode threshold number of encoded data slices in order to attempt to correct a bad byte of an encoded data slice. For instance, the DS client module 34 determines to recover two corrupted encoded data slices beyond the decode threshold number of encoded data slices in accordance with a formula: (7−5)/2=1. In particular, the DS client module 34 selects corrupted encoded data slices 5-7 for retrieval. In this example, slice 5 includes corrupted byte b2, slice 6 includes corrupted byte b1, and slice 7 includes corrupted byte b3. As used herein, the terms "corrupt", "corrupted", "likely corrupt" and "potentially corrupted" are used interchangeably as contextually appropriate.

Having selected the one or more corrupted encoded data slices for retrieval, the DS client module 34 facilitates retrieval of the selected corrupted encoded data slices. For example, the DS client module 34 issues, via the network 24, corrupted slice requests 5-7 to the storage units 5-7 and receives, via the network 24, corrupted encoded data slices 5-7 from the storage units 5-7.

Having received the selected corrupted encoded data slices, the DS client module 34 corrects at least one corrupted encoded data slice using at least one correction approach to produce the decode threshold number of uncorrupted encoded data slices. For example, the DS client module 34 selects a first approach (e.g., byte-by-byte slice decoding or slice substitution) based on available additional integrity information, attempts correction utilizing the first correction approach, and applies another correction approach when necessary (e.g., slice substitution when a data segment integrity value is known by the DS client module 34). Having corrected the at least one corrupted encoded data slice to produce the decode threshold number of uncorrupted encoded data slices, the DS client module 34 dispersed storage error decodes the decode threshold number of uncorrupted encoded data slices to produce an error free data segment 90.

Integrity information may be generated and applied in a variety of ways in accordance with the present disclosure. Some approaches may prove to be more fruitful than others, especially when applied in certain orders, as the computational complexity, bandwidth and latency costs of different approaches can differ significantly. By way of example and without limitation, various "levels" at which integrity information can be applied include:

level 1—integrity check or error correct information is applied to the data source (e.g., using an All-Or-Nothing (AONT) known value, CRC, hash, digital signature, or check sum of data before the data is sliced);

level 2—integrity check or error correct information is applied as part of an error encoding function to produce slices (e.g., the normal error coding used to generate slices from a pre-encoded data segment);

level 3—integrity check or error correct information is applied to each slice before transmission to storage units for storage (TCP check sums, TLS authentication codes, hash lists or sliced hash lists); and level 4—integrity check or error correct information is applied to each encoded data slice when stored by the storage unit (e.g., CRC/hash calculated and stored with the slice, error correction code (ECC) bits stored internally by file system or a memory device).

An integrity check failure can happen at various of such levels. For example, when reading an encoded data slice from a memory device, the storage unit may determine that the slice data does not match its corresponding stored integrity check value. This can result in an error being returned to the requester instead of the slice. However, in some cases the DS client module 34 may be able to recover partially corrupted encoded data slices by using inherently redundant information from other slices.

Accordingly, a special protocol request (e.g., a "ReadCorrupted" request) may be issued in response to reception of an integrity error following a slice request. Alternatively, a storage unit detecting a bad slice may return a read response including a slice and a flag indicating that the slice is likely corrupt (e.g., the storage unit may not be able to determine whether the data within the slice is corrupted or the integrity check value is wrong).

In most cases, absent any failure of "level 1" integrity check errors, the DS client module 34 may ignore slice-level integrity checks, and only rely on such checks should a level 2 or level 1 error occur. An example process for responding to different types of errors and performing data recovery in various ways is described below and in conjunction with FIG. 12.

Figure 11:
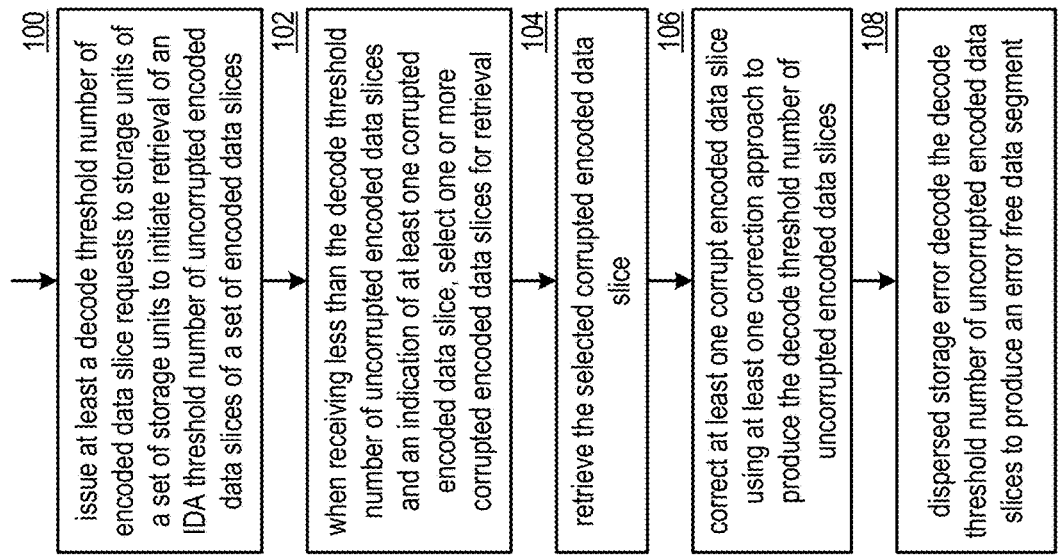
FIG. 11 is a logic diagram of an example of recovery of corrupted data in accordance with the present disclosure.

FIG. 11 is a logic diagram of an example of recovery of corrupted data in accordance with the present disclosure. In particular, a method is presented for use in conjunction with one or more functions and features described in conjunction with FIGS. 1-10. The method begins at step 100 where a processing module (e.g., of a distributed storage (DS) client module) issues at least a decode threshold number of encoded data slice requests to storage units of a set of storage units to initiate retrieval of a decode threshold number of uncorrupted encoded data slices of a set of stored encoded data slices. For example, the processing module generates the at least the decode threshold number of encoded data slice requests to include corresponding slice names, identifies corresponding storage units, and sends the generated encoded data slice requests to the identified corresponding storage units.

When receiving less than the decode threshold number of uncorrupted encoded data slices and an indication of at least one corrupted encoded data slice, the processing module next (step 102) selects one or more corrupted encoded data slices for retrieval. For example, the processing module receives (e.g., in response to a request) two corrupted encoded data slices beyond the decode threshold number of encoded data slices for each corrupted encoded data slice of the decode threshold number of encoded data slices.

The method continues at the step 104 where the processing module retrieves the selected corrupted encoded data slices. For example, the processing module issues a corrupted slice requests (e.g., a "ReadCorrupted" request). The method continues at the step 106 where the processing module corrects at least one corrupted encoded data slice using at least one correction approach to produce the decode threshold number of uncorrupted encoded data slices. For example, the processing module selects a first approach based on available integrity information (e.g., byte-by-byte slice decoding or slice substitution), attempts the correction, and applies another approach (e.g., slice substitution when a data segment integrity value is known by the processing module) when necessary to produce the decode threshold number of uncorrupted encoded data slices. The method continues at the step 108 where the processing module dispersed storage error decodes the decode threshold number of uncorrupted encoded data slices to produce an error free data segment 90.

Figure 12:
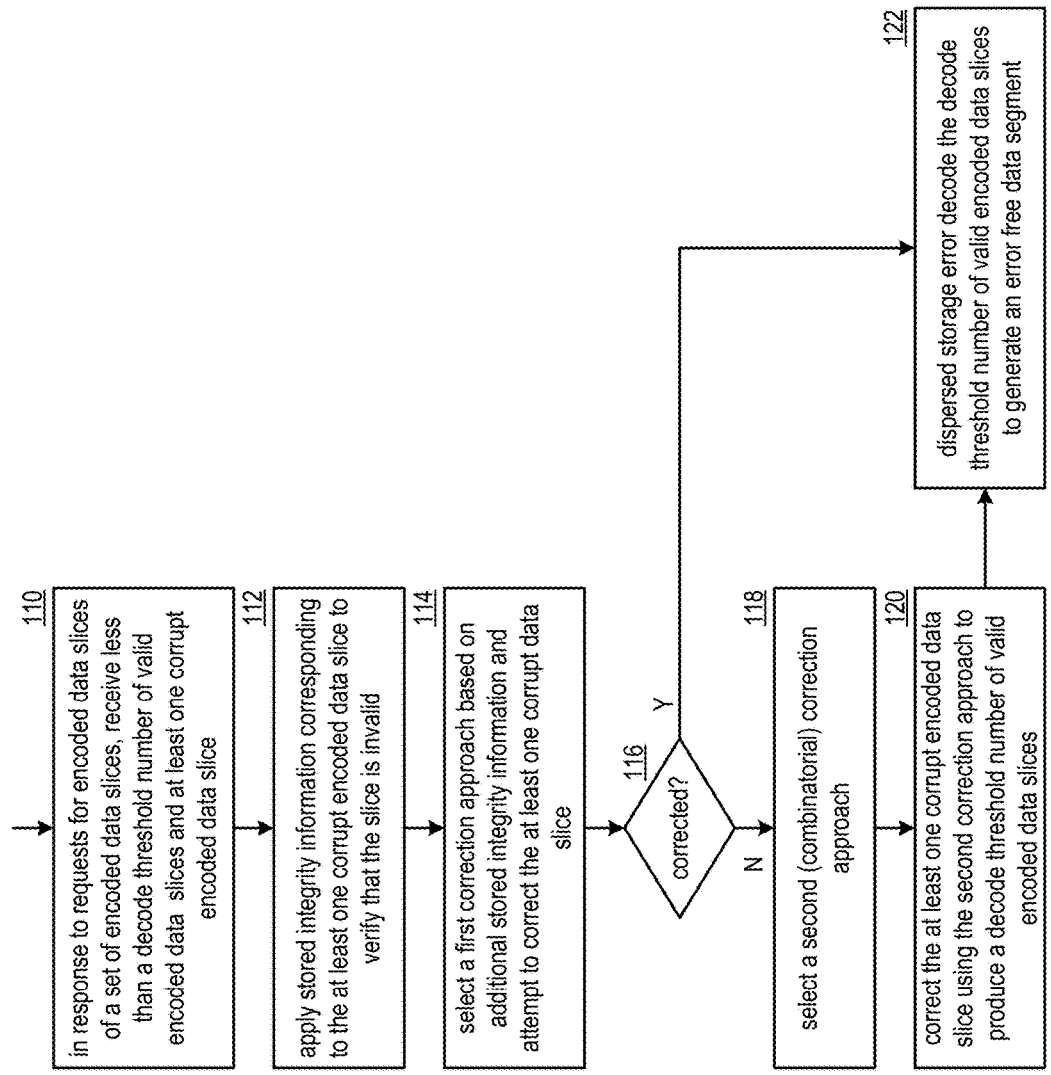
FIG. 12 is a logic diagram of a further example of recovery of corrupted data in accordance with the present disclosure.

FIG. 12 is a logic diagram of a further example of recovery of corrupted data in accordance with the present disclosure. In particular, a method is presented for use in conjunction with one or more functions and features described in conjunction with FIGS. 1-10. The method begins at step 110 where a processing module (e.g., of a distributed storage (DS) client module) issues slice requests in an attempt to retrieve at least a decode threshold number of encoded data slices from the relevant storage units. If integrity errors (e.g., level 4 errors) occur, the processing module may attempt to read additional encoded data slices until at least a decode threshold number of slices are returned without integrity failures. When the decode threshold number of encoded data slices are not successfully retrieved (e.g., due to storage unit unavailability or an abundance of level 4 integrity errors), the processing module requests and receives at least one corrupt encoded data slice, even if the slice(s) manifests level 4 integrity errors (e.g., the processing module may use a ReadCorrupted request as necessary). Note that if fewer than a relevant decode threshold number of valid and corrupt encoded data slices are returned from the storage units, or if correction approaches are unsuccessful, a failure indication may be provided in response to the read request that initiated the method.

Next, in step 112, the processing module applies stored integrity information corresponding to the at least one corrupt data slice. For example, if level 3 integrity information is available for the encoded data slices (e.g., a slice hash list), then that information may be used to establish known integrity check values for all received slices. This integrity information may be used to determine if any slices presumed to be corrupt might instead be valid. If a decode threshold number of slices with matching level 3 integrity information are identified, then an attempt to dispersed storage error decode the slices may be performed (e.g., step 122). Successful decoding can be verified using level 2 and level 1 integrity information.

If the at least one corrupt encoded data slice is verified to be invalid, (or if level 2 or level 1 integrity failures occur), the method proceeds to step 114 and a first correction approach is selected based on stored additional integrity information. For example, if at least two or more slices beyond the relevant decode threshold are received, the processing module may attempt to use level 2 integrity information (e.g., encoding redundancy information) to recover single byte errors in each byte position of the received slices. An additional 2 slices beyond the decode threshold may be required to correct each error present in the corresponding byte position of a given slice. In one example in which n=8 and k=10, having 16 available slices enables the correction of up to (16-10)/2=3 corrupt bytes in the same byte position (e.g., up to 3 corrupt bytes across the 16 slices when the bytes are all at the same offset position in each slice). In this example, having all 18 slices available would allow for the correction of up to 4 corrupt bytes. This approach can be used to attempt to restore a maximum number of corrupted byte positions in each offset in a given corrupt slice. After applying this process to modify the corrupt slices, level 3 integrity check information can be consulted to verify that the correction approach was successful in restoring corrupt slices.

If at least a decode threshold number of slices are determined to be valid (step 116) according to the level 3 integrity information, then the processing module attempts to dispersed storage error decode the slices in step 122. The decode operation can be verified using the level 1 or level 2 integrity information.

If the first correction approach is unsuccessful as determined in step 116, the processing module selects a second correction approach in step 118. The method then proceed to step 120 and the at least one corrupt encoded data slice is corrected using the second correction approach in order to produce a decode threshold number of valid encoded data slices. For example, if a level 1 or level 2 integrity error occurs after step 114 and all received slices are presumed to be valid, if there is at least one more slice than the decode threshold number of slices, the processing module may resort to a combinatorial decoding approach wherein different subsets of slices are excluded from the decode operation, and a decode and verification is attempted using level 1 and level 2 integrity check information. If no valid combination of slices can be identified using level 1 integrity check information, then a failure indication may be provided in response to the read request that initiated the method. If a combination of slices can be found which passes level 2 and level 1 integrity checks (as determined in step 122), the decoded data segment is returned to the requester.

With reference to FIG. 11, a combinatorial decoding approach might first utilize, for example, b1 of slices 1-4 and b1 of slice 5 in order to produce a first temporary decoding result. Additional temporary decoding results may be produced using b1 of slices 6 and 7. Comparison of the temporary results may then identify b1 of slice 6 as a corrupt byte. The temporary results of such a decoding approach may then be aggregated to recover an error free data segment.

If a valid data segment is decoded, the processing module may use it to determine which of the slices it received were valid and which were invalid. Invalid slices may be flagged/indicated for rebuilding, deletion, or rewritten to the storage units as valid slices. Even if write permission is not available for the storage units, a rebuild-write operation including valid slice integrity information may still succeed if, for example, a correct hash list is provided to the receiving storage unit and the storage unit verifies that the hash list is correct.

Figure 13:
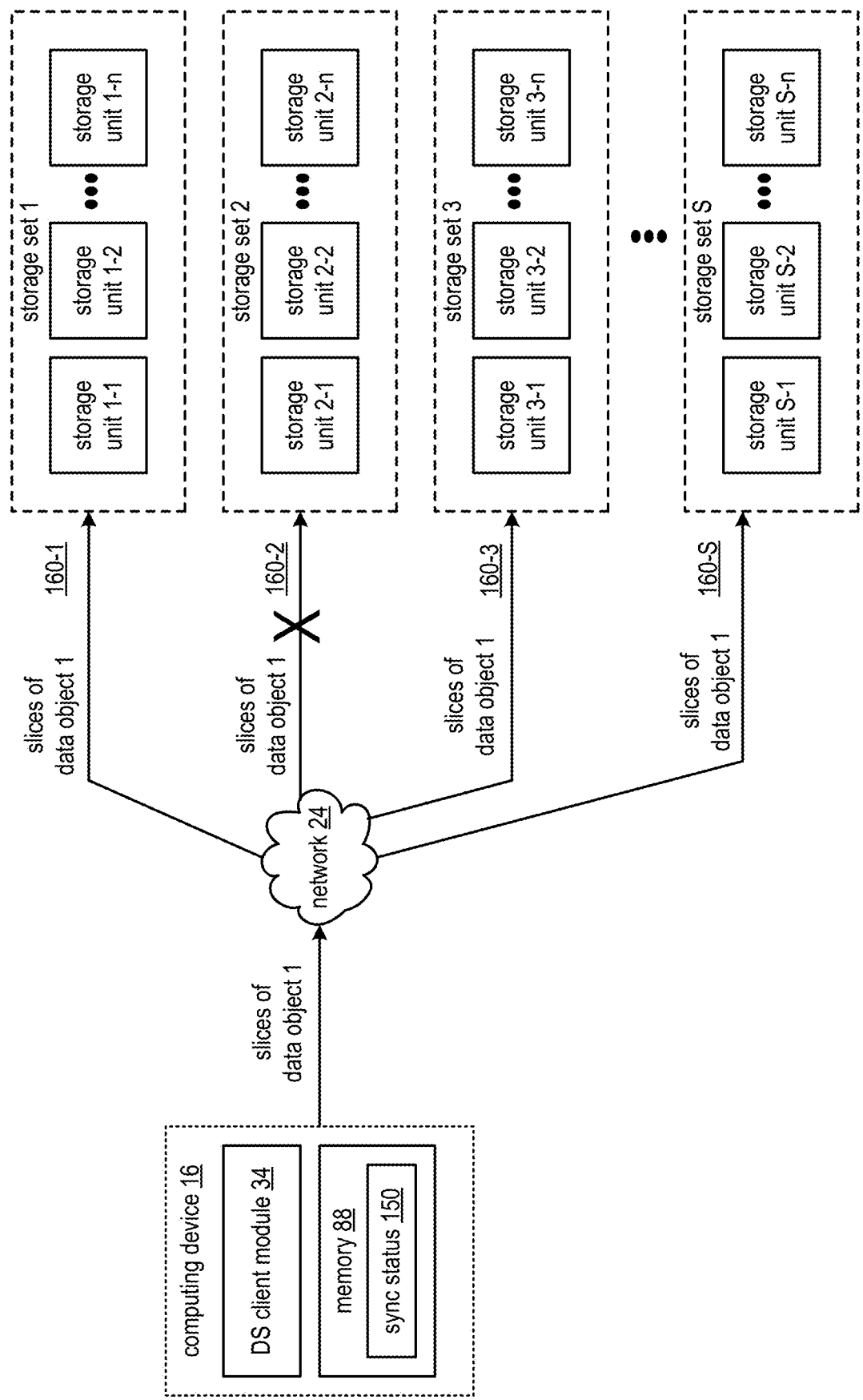
FIGS. 13-15 are schematic block diagrams of another embodiment of a storage network in accordance with the present disclosure.
Figure 14:
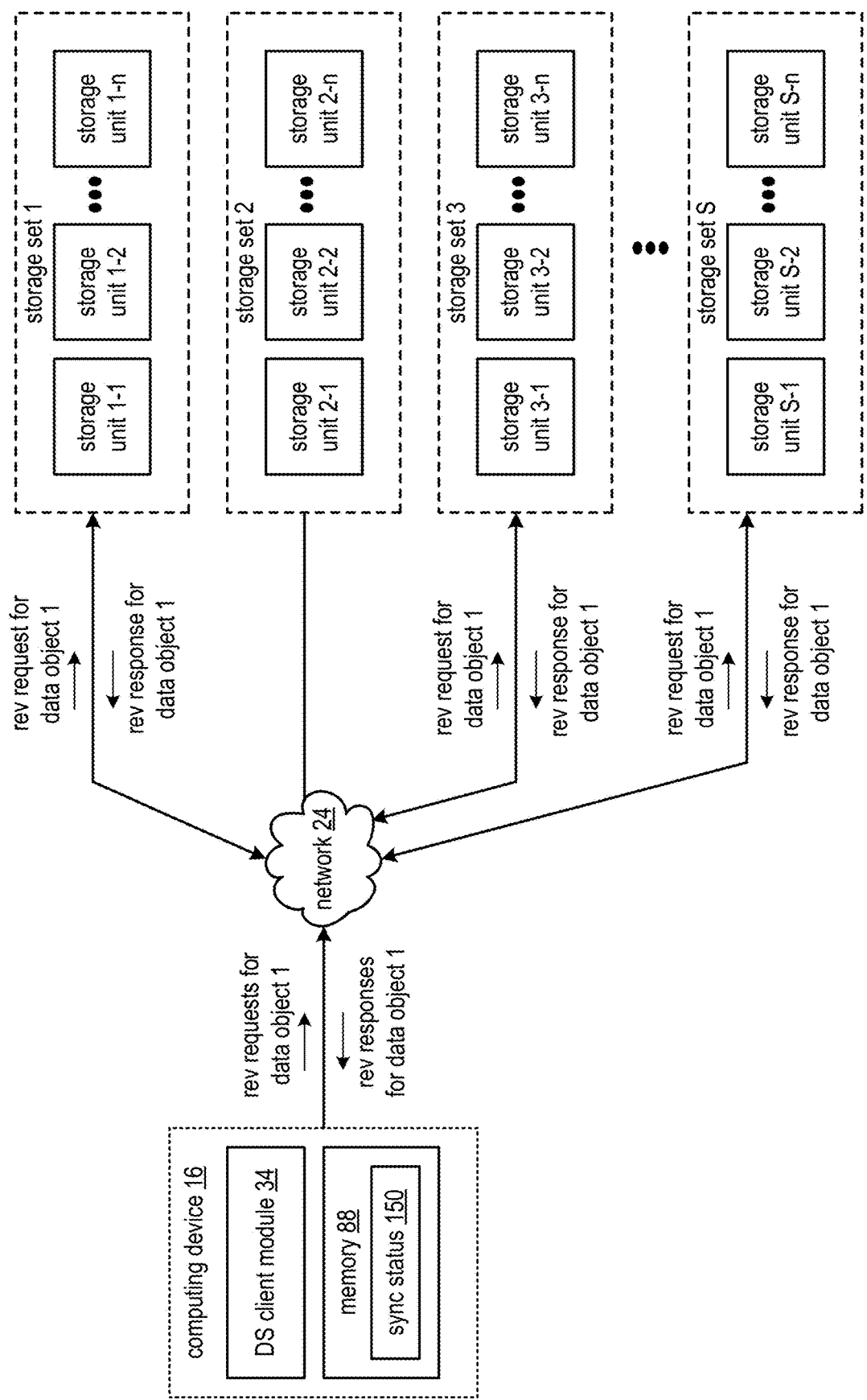
Figure 15:
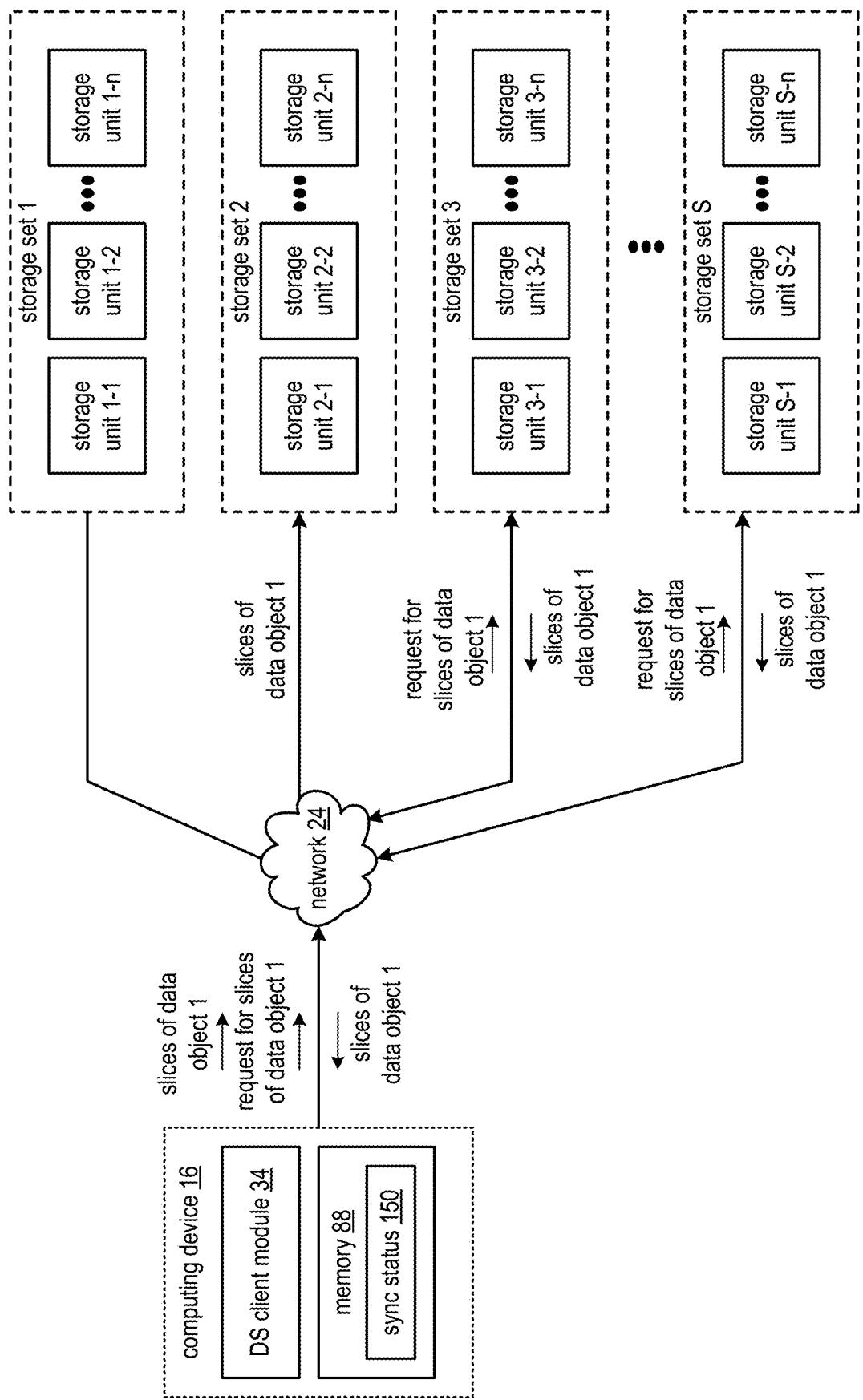

FIGS. 13-15 are schematic block diagrams of an embodiment of a storage network that includes synchronized replication of stored data. In an example, two or more vaults (e.g., memories of two or more storage sets of storage units) can be arranged in a "mirror configuration", such that any object written to one vault will eventually be replicated in the other vault and vice-versa. In this example, a processing module/computing device of the storage network (e.g., upon receiving a write request) is responsible for writing a data object to all locations comprising the mirror arrangement. For example, when storage set 1 and storage set 2 are configured for replicated storage, and a data object is stored through a processing module(s) to either storage set 1 or storage set 2, then the processing module will attempt to write the data object to both storage sets. However, there may be circumstances in which one or more storage units of a storage set (e.g., a storage set at a remote location) are temporarily unavailable or unreachable. As a result, it may not be possible to immediately write a copy of a data object to all of the storage sets of a mirror configuration. In such cases, data synchronization can eventually be restored, for example, through a synchronization status database or log that tracks the status of write operations, by periodically comparing object metadata (e.g., across all sets of devices supporting the storage of each storage set) and verifying that the same data objects are stored in all of the relevant storage sets, etc.

In an example, when a first vault contains a data object that is not present in a second, mirrored vault, or the data object is a newer version of the data object stored in the second vault, the data object is "synchronized" with the second vault by reading the latest available revision of the data object from the first vault and writing it to the second vault.

Referring more particularly to FIG. 13, the illustrated storage network includes the computing device 16 of FIG. 1, the network 24 of FIG. 1, and a plurality of storage sets 1-S. The computing device 16 includes a memory 88 and the dispersed storage (DS) client module 34 of FIG. 1. The memory 88 may be implemented utilizing one or more of solid-state memory, magnetic disk drive memory, optical disk drive memory, etc. Each storage set includes a set of storage units 1-*n*. Each storage unit may be implemented utilizing the storage unit 36 of FIG. 1. Hereafter, each storage set may be interchangeably referred to as a set of storage units. The storage network functions to synchronize replication of stored data amongst a plurality of storage facilities/storage sets.

FIG. 13 further illustrates an example of operation of synchronizing the replication of stored data where the DS client module 34 initiates storage of a data object in two or more storage sets. For example, the DS client module 34 identifies the two or more storage sets (e.g., associated with a common vault, a common user, a common data object, etc.), dispersed storage error encodes a data object 1 to generate a plurality of sets of encoded data slices, and sends, via the network 24, the plurality of sets of encoded data slices as slices of the data object 1 (160-1-160-S) to the identified two or more storage sets (e.g., all S storage sets).

Having initiated the storage of the data object, the DS client module 34 updates a synchronization status 150 for the two or more storage sets when detecting a failure to store at least a minimum number of encoded data slices to enable recovery in one of the storage sets. The synchronization status 150 includes, for example, the identities of data objects and revisions stored or not stored in each of the storage sets. For example, the DS client module 34 receives an indicator that storage of the plurality of sets of encoded data slices 160-2 in the storage set 2 has failed, generates the updated synchronization status 150 to include the identity of the storage set 2 and the identity of the data object 1, and stores the updated synchronization status in at least one of the memory 88 and/or a dispersed hierarchical index structure within one or more of the storage sets.

FIG. 14 further illustrates the example of operation of synchronizing the replication of the stored data where the DS client module 34 determines to resynchronize the two or more storage sets. For example, the processing module determines to resynchronize the storage sets in accordance with a synchronization schedule. As another example, the processing module determines to resynchronize the storage sets when detecting the availability of a previously unavailable storage set. Having determined to resynchronize, the DS client module 34 identifies a data object requiring resynchronization. For example, the DS client module 34 retrieves the synchronization status (e.g., from the memory 88 or from a dispersed hierarchical index structure), and selects an un-synchronized data object associated with a now-available storage set.

Having identified the data object requiring resynchronization, the DS client module 34 determines a latest available revision associated with the data object. Determining the latest available revision includes one or more of issuing revision requests, interpreting received revision responses, and selecting a source storage set associated with a desired revision (e.g., a newest revision). For example, the DS client module 34 issues, via the network 24, revision requests for data object 1 to each of the storage sets, receives, via the network 24, revision responses for data object 1, and interprets the received revision responses to identify the newest available revision. For instance, the DS client module 34 determines that the latest available revision is stored in storage set 3.

FIG. 15 further illustrates the example of operation of synchronizing the replication of the stored data where the DS client module 34 determines to resynchronize the two or more storage sets. Having determined the latest available revision, the DS client module 34 facilitates storage of the identified latest available revision of the data object in at least one storage set requiring the latest revision to satisfy the re-synchronization. For example, the DS client module 34 issues, via the network 24, a request for slices of data object 1 to the storage set 3, receives, via the network 24, slices of data object 1 from the storage set 3, identifies the at least one storage set requiring the latest revision (e.g., storage set 2 is identified as out of synchronization) and sends, via the network 24, the received slices of data object 1 to the identified at least one storage set (e.g., to the storage set 2).

In an additional example embodiment, dispersed data structures, such as the Dispersed Concurrent Lockless Index (DLCI), or even sub-regions of other storage types in a vault, can be used to store data object write failures. When a data object cannot be written to all vaults in a mirror configuration, a computing device of the network writes an entry into the dispersed data structure indicating the name of the data object that could not be fully synchronized (and optionally the time of the failure), and identity of the storage set(s) which did/did not succeed in storing the data object. From time to time, a synchronization process queries the dispersed data structure (e.g., traversing the DLCI, or listing of the sub-region of the vault) to find entries of data objects that were not fully synchronized. For example, by traversing the data structure in storage set 1, the synchronization agent can determine data objects written to at least storage set 1, but not to other storage sets in the mirror configuration of which storage set 1 is a part.

The synchronization agent then reads the entry to determine the name of the data object that was not fully synchronized and the latest revision of the data object by checking the current revision of this object as it exists in other currently accessible storage sets within the mirror. If every vault is not synchronized on this data object, the synchronization agent reads the latest revision of the data object from one of the storage sets that contains the latest available revision and then writes this revision of the data object to every storage set that does not have the latest available revision. Upon successfully writing this revision of the data object to all such storage sets, the synchronization agent verifies that all storage sets now have the same and latest revision for this object. Upon successful verification, the synchronization agent removes the entry from the dispersed data structure.

Figure 16:
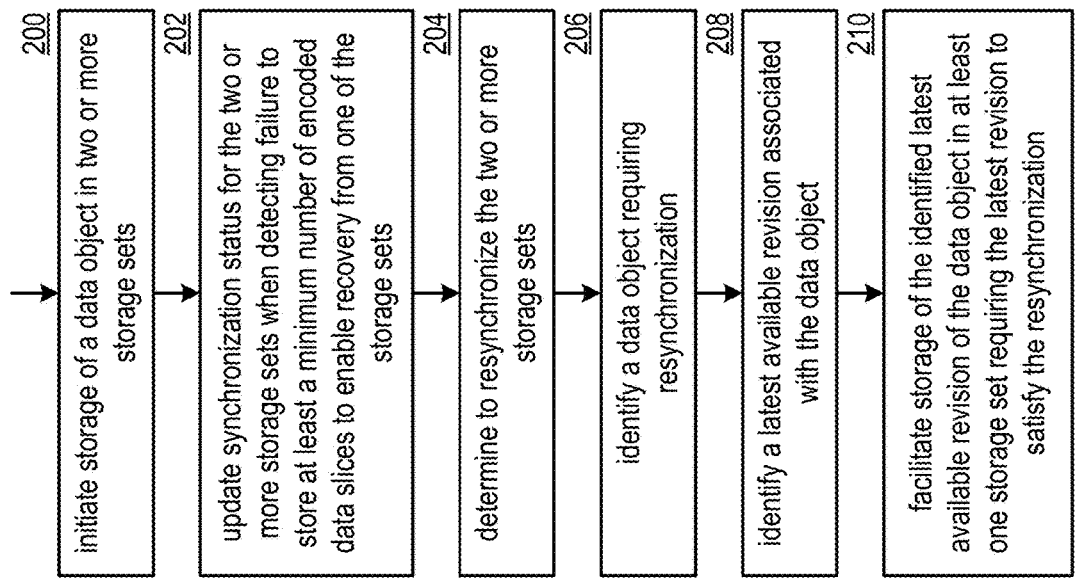
FIG. 16 is a logic diagram of an example of synchronizing replicated data in accordance with the present disclosure.

FIG. 16 is a logic diagram illustrating an example of synchronizing replication of stored data. In particular, a method is presented for use in conjunction with one or more functions and features described in conjunction with the preceding Figures. The method begins at step 200, where a processing module (e.g., of a distributed storage (DS) client module) initiates storage of a data object in two or more storage sets of a plurality of storage sets. For example, the processing module identifies the two or more storage sets (e.g., from system configuration information), generates a plurality of sets of encoded data slices, and sends the plurality of sets of encoded data slices to the identified two or more storage sets.

The method continues at the step 202, where the processing module updates the synchronization status for the two or more storage sets when detecting a failure to store at least a minimum number of encoded data slices to enable recovery from one of the storage sets. For example, the processing module generates the updated synchronization status to indicate an identity of the storage set and the data object, and stores the updated synchronization status in at least one of a local memory or a dispersed hierarchical index structure within one or more of the storage sets.

The method continues at step 204, where the processing module determines to resynchronize the two or more storage sets. Determining to resynchronize can be based on one or more of interpreting a synchronization schedule, a request, and detecting availability of a previously unavailable storage set. The method continues at step 206, where the processing module identifies a data object requiring resynchronization. For example, the processing module retrieves the synchronization status, and selects an un-synchronized data object associated with a now-available storage set.

The method continues at step 208, where the processing module identifies a latest available revision associated with the data object. For example, the processing module issues revision requests to the plurality of storage sets, receives revision responses, and selects a source storage set associated with a desired revision (e.g., a storage set storing the latest revision of the data object).

The method continues at step 210, where the processing module facilitates storage of the identified latest available revision of the data object in at least one storage set requiring the latest revision to satisfy the resynchronization. For example, the processing module issues a request for encoded data slices of the latest revision of the data object from the source storage set, receives the encoded data slices of the latest revision of the data object, identifies the at least one storage set requiring the latest revision (e.g., based on revision responses), and sends the encoded data slices of the latest revision of the data object to the identified at least one storage set.

The methods described above in conjunction with the computing device and the storage units can alternatively be performed by other modules of the distributed storage network or by other devices. For example, any combination of a first module, a second module, a third module, a fourth module, etc. of the computing device and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the distributed storage network (DSN), cause the one or more computing devices and/or the storage units to perform any or all of the method steps described above.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., indicates an advantageous relationship that would be evident to one skilled in the art in light of the present disclosure, and based, for example, on the nature of the signals/items that are being compared. As may be used herein, the term "compares unfavorably", indicates that a comparison between two or more items, signals, etc., fails to provide such an advantageous relationship and/or that provides a disadvantageous relationship. Such an item/signal can correspond to one or more numeric values, one or more measurements, one or more counts and/or proportions, one or more types of data, and/or other information with attributes that can be compared to a threshold, to each other and/or to attributes of other information to determine whether a favorable or unfavorable comparison exists. Examples of such an advantageous relationship can include: one item/signal being greater than (or greater than or equal to) a threshold value, one item/signal being less than (or less than or equal to) a threshold value, one item/signal being greater than (or greater than or equal to) another item/signal, one item/signal being less than (or less than or equal to) another item/signal, one item/signal matching another item/signal, one item/signal substantially matching another item/signal within a predefined or industry accepted tolerance such as 1%, 5%, 10% or some other margin, etc. Furthermore, one skilled in the art will recognize that such a comparison between two items/signals can be performed in different ways. For example, when the advantageous relationship is that signal 1 has a greater magnitude than signal 2, a favorable comparison may be achieved when the magnitude of signal 1 is greater than that of signal 2 or when the magnitude of signal 2 is less than that of signal 1. Similarly, one skilled in the art will recognize that the comparison of the inverse or opposite of items/signals and/or other forms of mathematical or logical equivalence can likewise be used in an equivalent fashion. For example, the comparison to determine if a signal X>5 is equivalent to determining if −X<−5, and the comparison to determine if signal A matches signal B can likewise be performed by determining—A matches—B or not(A) matches not(B). As may be discussed herein, the determination that a particular relationship is present (either favorable or unfavorable) can be utilized to automatically trigger a particular action. Unless expressly stated to the contrary, the absence of that particular condition may be assumed to imply that the particular action will not automatically be triggered. In other examples, the determination that a particular relationship is present (either favorable or unfavorable) can be utilized as a basis or consideration to determine whether to perform one or more actions. Note that such a basis or consideration can be considered alone or in combination with one or more other bases or considerations to determine whether to perform the one or more actions. In one example where multiple bases or considerations are used to determine whether to perform one or more actions, the respective bases or considerations are given equal weight in such determination. In another example where multiple bases or considerations are used to determine whether to perform one or more actions, the respective bases or considerations are given unequal weight in such determination.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of a storage network, the method comprises:
   identifying at least a first storage set and a second storage set for replicated storage of data;
   maintaining a synchronization schedule for the first storage set and the second storage set;
   initiating storage of a data object in the first storage set, including:
      encoding the data object with first dispersed storage error encoding parameters to generate a first plurality of encoded data slices; and
      sending the first plurality of encoded data slices to the first storage set;
   determining, based at least in part on the synchronization schedule, to synchronize the first storage set and the second storage set;
   determining that the second storage set requires the data object to maintain synchronization with the first storage set; and
   in response to determining that the second storage set requires the data object, facilitating storage of the data object in the second storage set, including:
      retrieving the first plurality of encoded data slices from the first storage set;
      decoding the first plurality of encoded data slices, using the first dispersed storage error encoding parameters, to reproduce the data object;
      encoding the reproduced data object, using second dispersed storage error encoding parameters, to generate a second plurality of encoded data slices; and
      sending the second plurality of encoded data slices to the second storage set for storage therein.

2. The method of claim 1, further comprising:
   maintaining a synchronization log that tracks the status of write operations to the first storage set and the second storage set,
   wherein determining that the second storage set requires the data object to maintain synchronization with the first storage set is based, at least in part, on the synchronization log.

3. The method of claim 2, wherein maintaining the synchronization log includes updating the synchronization log in response to detecting a failure to store a portion of the data object in the second storage set.

4. The method of claim 1, wherein facilitating storage of the data object in the second storage set includes:
   retrieving the data object from the first storage set; and
   sending the data object to the second storage set for storage therein.

5. The method of claim 1, wherein determining to synchronize the first storage set and the second storage set is further based on detecting a return to availability of the second storage set after a period of unavailability.

6. The method of claim 1, wherein determining to synchronize the first storage set and the second storage set is further based on detecting a return to availability of the first storage set after a period of unavailability.

7. The method of claim 1, wherein the first dispersed storage error encoding parameters differ from the second dispersed storage error encoding parameters.

8. The method of claim 1, wherein facilitating storage of the data object in the second storage set includes performing an integrity check on the data object.

9. A computing device comprises:
   at least one interface;
   memory that stores operational instructions; and
   one or more processing modules operably coupled to the at least one interface and the memory, wherein the one or more processing modules are configured to execute the operational instructions to:
      identify at least a first storage set and a second storage set for replicated storage of data;
      maintain a synchronization schedule for the first storage set and the second storage set;
      initiate storage of a data object in the first storage set, including:
         encoding the data object with first dispersed storage error encoding parameters to generate a first plurality of encoded data slices; and
         sending, via the at least one interface, the first plurality of encoded data slices to the first storage set;
      determine, based at least in part on the synchronization schedule, to synchronize the first storage set and the second storage set;
      determine that the second storage set requires the data object to maintain synchronization with the first storage set; and in response to determining that the second storage set requires the data object, facilitate storage of the data object in the second storage set, including:
retrieving, via the at least one interface, the first plurality of encoded data slices from the first storage set;
decoding the first plurality of encoded data slices, using the first dispersed storage error encoding parameters, to reproduce the data object;
encoding the reproduced data object, using second dispersed storage error encoding parameters, to generate a second plurality of encoded data slices; and
sending, via the at least one interface, the second plurality of encoded data slices to the second storage set for storage therein.

10. The computing device of claim 9, wherein the one or more processing modules are further configured to execute the operational instructions to:
maintain a synchronization log that tracks the status of write operations to the first storage set and the second storage set,
wherein determining that the second storage set requires the data object to maintain synchronization with the first storage set is based, at least in part, on the synchronization log.

11. The computing device of claim 10, wherein maintaining the synchronization log includes updating the synchronization log in response to detecting a failure to store a portion of the data object in the second storage set.

12. The computing device of claim 10, wherein facilitating storage of the data object in the second storage set includes performing an integrity check on the data object.

13. The computing device of claim 9, wherein facilitating storage of the data object in the second storage set includes:
retrieving, via the at least one interface, the data object from the first storage set; and
sending, via the at least one interface, the data object to the second storage set for storage therein.

14. The computing device of claim 9, wherein determining to synchronize the first storage set and the second storage set is further based on detecting a return to availability of the second storage set after a period of unavailability.

15. The computing device of claim 9, wherein determining to synchronize the first storage set and the second storage set is further based on detecting a return to availability of the first storage set after a period of unavailability.

16. The computing device of claim 9, wherein the first dispersed storage error encoding parameters differ from the second dispersed storage error encoding parameters.

17. A computer readable storage medium comprises:
at least one non-transitory memory section that stores operational instructions that, when executed by one or more processing modules of a computing device of a storage network, causes the computing device to:
identify at least a first storage set and a second storage set for replicated storage of data;
maintain a synchronization schedule for the first storage set and the second storage set;
initiate storage of a data object in the first storage set, including:
encoding the data object with first dispersed storage error encoding parameters to generate a first plurality of encoded data slices; and
sending the first plurality of encoded data slices to the first storage set;
determine, based at least in part on the synchronization schedule, to synchronize the first storage set and the second storage set;
determine that the second storage set requires the data object to maintain synchronization with the first storage set; and
in response to determining that the second storage set requires the data object, facilitate storage of the data object in the second storage set, including:
retrieving the first plurality of encoded data slices from the first storage set;
decoding the first plurality of encoded data slices, using the first dispersed storage error encoding parameters, to reproduce the data object;
encoding the reproduced data object, using second dispersed storage error encoding parameters, to generate a second plurality of encoded data slices; and
sending the second plurality of encoded data slices to the second storage set for storage therein.

18. The computer readable storage medium of claim 17, wherein the at least one non-transitory memory section stores additional operational instructions that, when executed by the one or more processing modules of the computing device, causes the computing device to:
maintain a synchronization log that tracks the status of write operations to the first storage set and the second storage set,
wherein determining that the second storage set requires the data object to maintain synchronization with the first storage set is based, at least in part, on the synchronization log.

19. The computer readable storage medium of claim 18, wherein maintaining the synchronization log includes updating the synchronization log in response to detecting a failure to store a portion of the data object in the second storage set.

* * * * *